United States Patent [19]

Chang

[11] 4,165,395

[45] Aug. 21, 1979

[54] PROCESS FOR FORMING A HIGH ASPECT RATIO STRUCTURE BY SUCCESSIVE EXPOSURES WITH ELECTRON BEAM AND ACTINIC RADIATION

[75] Inventor: Tai Hon P. Chang, Chappaqua, N.Y.

[73] Assignee: International Business Machines Corporation, Armonk, N.Y.

[21] Appl. No.: 811,757

[22] Filed: Jun. 30, 1977

[51] Int. Cl.² .......................... B05D 3/06; B32B 3/10
[52] U.S. Cl. ...................................... 427/43; 96/35.1;
96/36.2; 427/259; 427/270
[58] Field of Search ........................ 427/43, 259, 270;
96/35.1, 36.2, 68, 69, 71

[56] References Cited

U.S. PATENT DOCUMENTS

| | | | |
|---|---|---|---|
| 3,761,264 | 9/1973 | Sterzer | 96/36.2 |
| 3,982,943 | 9/1976 | Feng et al. | 96/68 |
| 4,018,938 | 4/1977 | Feder et al. | 427/43 |
| 4,022,927 | 5/1977 | Pfeiffer et al. | 427/43 |
| 4,024,293 | 5/1977 | Hatzakis | 427/43 |

OTHER PUBLICATIONS

Romankiw, "IBM Tech. Disc. Bull.", vol. 18, No. 12, May 1976, pp. 4219–4221.
Spiller et al., "Solid State Technology", Apr. 1976, pp. 62–67.

*Primary Examiner*—John H. Newsome
*Attorney, Agent, or Firm*—Graham S. Jones, II

[57] ABSTRACT

A high aspect ratio structure (with a large height-to-linewidth ratio) is formed on a substrate by means of two resist layers with different kinds of radiation to which they are sensitive, respectively, with an actinic radiation sensitive resist below and an electron sensitive resist above. In addition, a metallic film is shaped by means of exposure of the upper layer of resist to form a metallic mask through which the lower layer of resist is exposed. Exposure may be performed by a "subtractive" technique or an "additive" technique. In the case of the subtractive technique, the substrate is coated by a first actinic resist above which are deposited first a metallic film and then a top layer of electron resist. The top resist layer is exposed and developed and the metal layer is etched so the lower resist can be exposed and developed with the pattern formed in the metal, with the pattern shape originally exposed in the top layer of resist extending down to the substrate.

In the additive technique, the pair of resists is deposited first with the actinic resist layer below and the electron resist layer above. The electron beam exposes the electron resist which is developed to provide openings. Then, a metallic layer is deposited and the electron resist which remains is removed with some of the metal in a lift-off step. The openings provided in the metal during the lift-off step are used as apertures for exposure of the lower resist layer to actinic radiation. The lower resist is developed, yielding a high aspect ratio structure as was done in the first case.

16 Claims, 9 Drawing Figures

PROCESS FOR FORMING A HIGH ASPECT RATIO STRUCTURE BY SUCCESSIVE EXPOSURES WITH ELECTRON BEAM AND ACTINIC RADIATION

BACKGROUND OF THE INVENTION

1. Field of the Invention

This invention relates to coating and, more particularly, to direct application of electron irradiation and subsequent application of wave energy, preferably in the form of X-ray or short wavelength ultraviolet (deep UV) radiation.

2. Description of the Prior Art

Grebe, U.S. Pat. No. 3,849,136 entitled "Masking of Deposited Thin Films by Use of a Masking Layer Photoresist Composite," teaches provision of an aluminum mask for an actinic photoresist beneath it. A substrate is coated with layers of AZ-1350H photoresist (Shipley), separated by a layer of aluminum deposited by evaporation with the underlying resist maintained at room temperature. The upper layer also composed of actinic resist is exposed to a pattern by a conventional mask and is developed. Then openings in the aluminum are etched through the openings in the upper photoresist mask. Finally, all of the remaining upper layer of resist and the lower resist exposed by etching the openings in the aluminum mask are subjected to overexposure and then to development to provide undercut of the resist below the metal mask, providing a substantial overhang of the metal mask at all openings beyond the underlying photoresist of the lower layer of photoresist. Subsequently, the entire mask structure is removed by means of a lift-off process.

Franco et al., U.S. Pat. No. 3,873,361 entitled "Method of Depositing Thin Film Utilizing a Lift-Off Mask," shows depositing an organic polymer, actinic light sensitive photoresist layer which is baked to such an extent that it is no longer photosensitive (like a Bakelite layer). Then an inorganic, preferably metallic layer is deposited, composed preferably of copper, aluminum, chromium, glass, $Si_3N_4$, or $Al_2O_3$. Next, an upper layer of actinic photoresist is deposited, exposed through a mask and developed. The metal is etched chemically only through the new openings in the upper photoresist. Then, the newly formed integral metallic mask is used as a mask for the lower baked resist which is removed by sputter etching to produce a substantial overhang of the metallic layer through which a thin metallic film is evaporated. Then, the entire mask structure is removed by means of a lift-off process.

A similar lift-off process is shown in Bergrasse's publication entitled "Two-Resist Layers Lift-Off Process," IBM Technical Disclosure Bulletin, Vol. 16, No. 7, December 1973, pp. 2110–2111, which is intended to be used instead of an electron beam exposure system, using exposure of the two layers of actinic sensitive resist separately rather than electron sensitive resist, with an intermediate metallic (Cr) layer used as an integral mask prior to depositing through openings in the metal mask and a lift-off step. Note that the exposure through the metallic mask is achieved by using a variable angle of incidence, such as a rotating prism.

U.S. Pat. No. 3,447,924 of Trzyna et al. entitled "Aligning Method," employs a workpiece coated on both sides with visible light negative actinic photoresist, then on both sides with an X-ray sensitive emulsion. X-radiation is applied to one side passing through to the other side so that the image is developed on both sides, uncovering some parts of the visible-photoresist on both sides. The uncovered photoresist is then exposed on both sides. All X-ray resist is removed. The photoresist is developed and unexposed resist is removed. Then the workpiece is etched through the photoresist on both sides.

U.S. Pat. No. 3,874,916 of Livesay et al. entitled "Mask Alignment System for Electron Beam Pattern Generator," shows a substrate of glass coated with a thin film layer of chromium, which in turn is coated with an "electron resist." Then a thin film of a conductive metal such as Al is applied. Over the conductive metal is applied a thin film of a photosensitive actinic photoresist layer. The photoresist is exposed to a master mask (grid) and is developed. The conductive layer, which is then uncovered by developing photoresist, is etched through the openings in the resist. Subsequently, the electron sensitive resist can be exposed by scanning of the electron resist with an electron beam under computer control.

U.S. Pat. No. 3,679,497 of Handy et al. entitled "Electron Beam Fabrication System and Process for Use Thereof," describes exposure of an electron sensitive resist with an electron beam from a "photocathode" which is a body of material such as quartz substantially transparent to ultraviolet light, which has a pattern formed upon it of a metal which emits an electron beam in response to ultraviolet radiation. The exposed resist is then developed to open holes in the resist. Subsequently, other layers of electron sensitive resist can be added, and then a separate photocathode can be employed for each layer of electron sensitive resist. However, each layer of resist is exposed and developed before the next one is added.

None of the prior art offers a process which has the facility of using an electron beam exposure system which can be driven by a computer, plus the superior high aspect ratios which can be achieved by means of actinic exposure techniques and preferably X-ray or deep UV exposure techniques, which provide steep and straight side walls.

An object of this invention is to provide a method for producing masks for thin film fabrication processes employing resist materials, wherein the pattern can be generated effectively and the aspect ratio is high.

Another object of this invention is to provide a thin film resist with openings having straight side walls without undercut.

In accordance with this invention, a method is provided for forming a high aspect ratio pattern of openings in a resist structure. A first layer of a resist sensitive to actinic electromagnetic radiation in the visible light to X-ray range preferably from about 2 A to 5000 A in wavelength is applied to a substrate. Then an electron sensitive resist layer is applied over the actinic resist. The electron sensitive resist is then exposed to an electron beam operating to write a predetermined pattern in the resist, which pattern is subsequently developed. That pattern is then employed to form a corresponding pattern in a metallic thin film lying on the first layer. The metallic film is deposited on the first layer either before the electron resist layer or after the pattern has been formed in the electron sensitive resist. Next, the metallic thin film is employed as a mask for exposing the first layer of resist to radiation in the actinic range of frequencies. The first layer of resist is then developed.

In another aspect of this invention, the upper resist and lower resist layers can be composed of similar or identical resist materials and the exposure of the upper resist is performed with such an energy level that the lower layer of resist remains unexposed and the metallic layer, if in between resist layers, provides protection of the lower layer of resist. This is particularly appropriate for the case in which the metal film is formed by the subtractive process.

In an especially preferred embodiment, the lower resist is exposed by a source of X-ray or deep UV radiation.

Definition

Actinic radiation as employed herein refers to electromagnetic radiation such as light and X-rays with wavelengths generally in the 2–5000 A range, as distinguished from electron beam radiation.

DESCRIPTION OF A PREFERRED EMBODIMENT

Figure 1A:
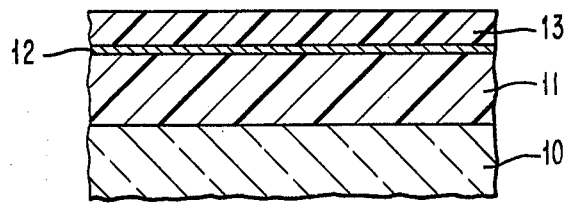
FIG. 1A shows a substrate coated with a lower layer of an actinic radiation sensitive positive resist, then a thin metallic film layer followed by an upper layer of an electron sensitive resist.

A sample 10 in FIG. 1A which can be a wafer or a mask plate is covered with a layer of resist 11 which is sensitive to radiation from the X-ray to the optical range of frequencies from 2 A–5000 A wavelengths. The thickness of the resist 11 is preselected in accordance with the thickness required to provide the aspect ratio desired in the final pattern of the product to be produced.

Figure 1B:
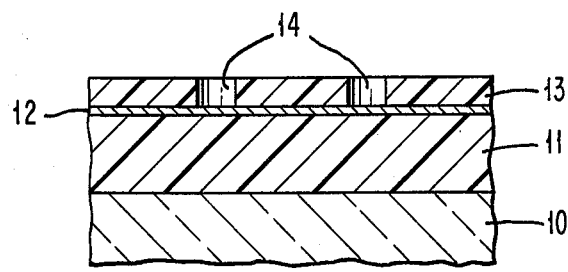
FIG. 1B shows the product of FIG. 1A after the upper layer of resist has been exposed by an electron beam and developed.

Next, a thin metallic film 12 composed of a metal such as aluminum, gold, or chromium is deposited on top of resist 11. Film 12 is intended to be patterned as shown in FIG. 1B to serve as an intermediate mask for the frequency of X-ray or visible radiation to which resist 11 is sensitive. The choice of its thickness depends upon the specific exposure technique employed. For example, for an X-ray system, film 12 should be several thousand Angstroms (8–10 Angstrom wavelength range) thick for the case of gold or thicker as an inverse function of wavelength. For optical range radiation, film 12 should be a few hundred Angstroms to a few thousand Angstroms thick for the UV exposure range of wavelengths from about 2000 to 5000 Angstroms, for example, using chromium or aluminum.

Above film 12, a layer of an electron beam sensitive, preferably positive, resist 13 such as PMMA (polymethyl methacrylate), or a copolymer of methyl methacrylate and methacrylic acid [P(MMA/MAA)] hereinafter referred to as the copolymer resist (as described in U.S. patent application Ser. No. 752,949 now U.S. Pat. No. 4,087,569) is deposited to a thickness of about a few thousand Angstroms, for example.

In FIG. 1B, there are shown holes 14 in resist 13 which are produced by exposure with a conventional electron beam which is scanned and exposed only upon specific regions of resist 13 to permit opening of holes 14 when the resist is developed. The electron beam pattern can also be exposed by projection techniques.

Figure 1C:
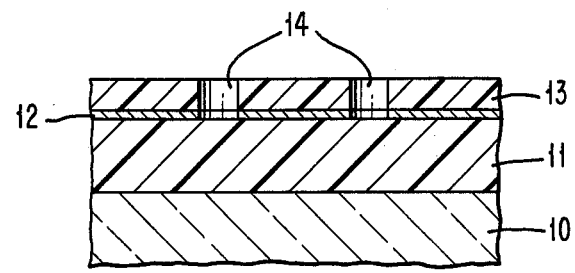
FIG. 1C shows the product of FIG. 1B after the metallic layer has been etched through the openings in the upper layer.

In FIG. 1C, the product of the steps of FIG. 1B is shown after the metallic film 12 has been removed through holes in resist 13 by a technique such as liquid chemical etching, reactive ion etching, or ion milling. Since the film 12 is usually only a few thousand Angstroms thick, the thickness of the top layer of resist 13 required to protect the film 12 from the etchant, etching gases or ions is relatively small. Therefore, a high aspect ratio of the pattern is not required because for a thin layer such as film 12, the etching process will not be likely to break through the resist in the wrong places, since little etching is required to remove the thin layer of metal.

Figure 1D:
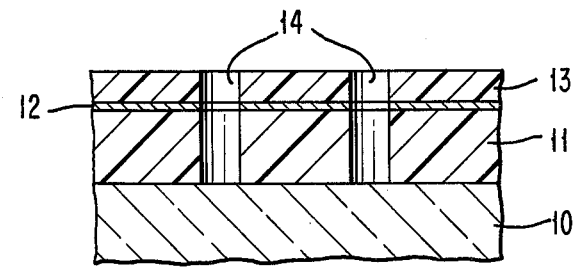
FIG. 1D shows the product of FIG. 1C after actinic wave energy has been applied to expose the lower layer with a high aspect ratio of exposure leading to a high aspect ratio structure after development.

FIG. 1D shows the product of the steps of FIG. 1C after it has been subject to exposure by an actinic radiation in whichever frequency range to which the resist 11 is sensitive. The portions of resist 11 below the holes 14 are then exposed and subsequently developed to expose the substrate 10 which can be a wafer or a mask plate upon which structures can be formed. One can etch substrate 10 or can use the mask for liftoff or plating into the mask, which are all examples of applications of such a high aspect ratio resist structure. Resist 11 should have a low degree of sensitivity to the form of radiation employed to expose resist 13, although it may be sensitive to such radiation. The electron beam radiation is likely to penetrate several microns of material. However, the metallic film 12 blocks development of any of the bottom resist layer even if exposed by the electron beam. The electron beam energy can be adjusted to a level at which the electrons are substantially blocked by metallic film 12. The intensity of the electron beam is low enough so that the tendency of the resist layers 13 and 11 and the metallic film 12 to be melted or evaporated is substantially avoided. The intensity required to expose without overheating the resist will be well understood by those skilled in the art and will vary from one electron beam resist to another. An example of an electron beam resist is PMMA, as described above.

Figure 2A:
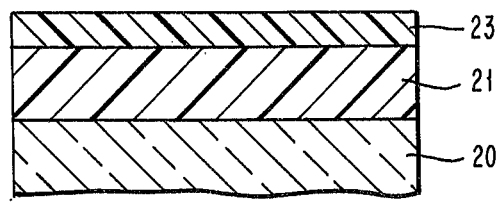
FIG. 2A shows a substrate coated with a lower layer of a resist sensitive to actinic radiation and an upper layer of an electron sensitive resist.

FIG. 2A shows a substrate 20 coated with an actinic positive resist 21 sensitive to X-ray or optical range of frequency radiation such as PMMA, coated with an electron sensitive resist 23 such as the copolymer resist.

The developer used for the upper layer such as the copolymer resist should not attack, in any substantial way, the lower (PMMA) resist.

Figure 2B:
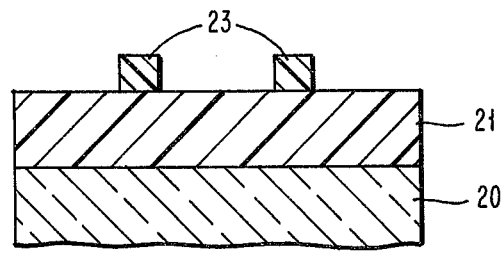
FIG. 2B shows the product of FIG. 2A after an electron beam has scanned across the upper layer of resist which has been developed to produce the pattern shown.

In FIG. 2B, the product of FIG. 2A is shown after the electron sensitive resist 23 has been exposed and developed leaving the structures shown behind which preferably have an undercut for liftoff as is well known in the electron beam exposure art.

Figure 2C:
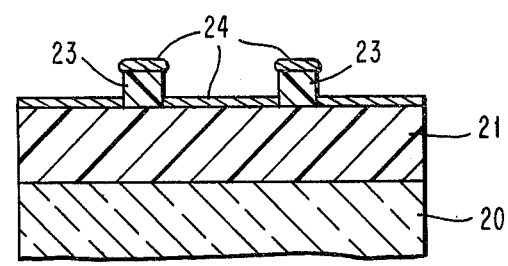
FIG. 2C shows the product of FIG. 2B after a thin film of a metal is deposited.
Figure 2D:
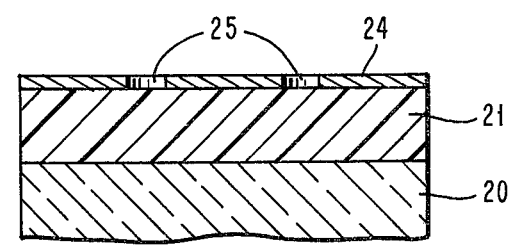
FIG. 2D shows the product of FIG. 2C after the remaining electron resist has been removed to lift off the metal thereabove exposing openings, yielding a metal mask similar to that of FIG. 1C, with the upper resist omitted.

In FIG. 2C, a thin film of a metal such as Al, Cr, or Au is deposited upon the top of the product of FIG. 2B yielding mushroom-like structures with metallic caps. Then a solvent is applied to remove the remaining electron sensitive resist and metallic caps, thereby removing the mushroom-like structures as shown in FIG. 2D to expose openings 25 in metallic film 24 which now comprises an in-place integral metal mask as in FIG. 1C.

Figure 2E:
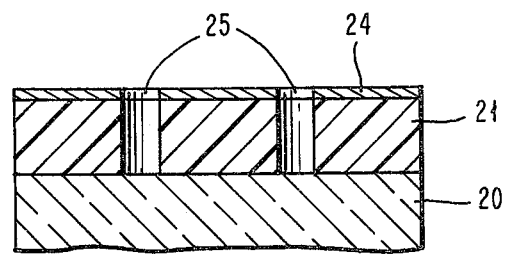
FIG. 2E shows the product of FIG. 2D after the lower resist has been exposed to actinic radiation and developed to open high aspect ratio apertures in the lower resist.

Then actinic radiation is applied through apertures 25 to provide a high aspect ratio exposure which is developed as shown in FIG. 2E to provide the high aspect ratio openings shown there by means of the additive process.

It has been found that X-ray or deep ultraviolet radiation exposure of the lower resist yields a very low amount of scattering to provide a very high aspect ratio.

SUMMARY

The electron beam technique offers the advantages of high resolution and flexibility, and patterns can be written under direct control of a computer without the need of a mask. However, it has difficulty in achieving very high aspect ratio (i.e., height to linewidth ratio) in the exposed pattern because of the electron scattering effect. In practice, to exceed an aspect ratio of 1:1 can be a challenge in some cases. In the case of X-ray and other actinic exposure techniques (other actinic includes both conventional UV and deep UV), direct writing under computer control is not possible, but a high aspect ratio can in general be more readily achieved. For example, patterns exposed by X-ray have shown aspect ratios in excess of 10:1. This invention comprises a new technique by which the direct writing advantage of an electron beam and the high aspect ratio advantage of X-ray and other actinic exposures are combined.

A preferred embodiment of the subtractive application of this new exposure technique is outlined in the following steps:

Step 1, Sample Preparation: (FIG. 1A) The sample (wafer or mask plate) is first covered with a layer of resist which is suitable for X-ray or other actinic exposure. The thickness of this layer will be determined by the aspect ratio required of the final pattern. A thin metallic film, such as aluminum, gold or chromium, is then deposited on top of the resist layer. This film will later serve as a mask for the X-ray or other actinic exposure, and the choice of its material and thickness will therefore depend upon the specific exposure technique used. Finally, a layer of electron resist is deposited on top of the metal film. This completes the sample preparation.

Step 2, Electron Beam Exposure: (FIG. 1B) The electron beam is used to expose the required pattern on the top resist layer, and the resist is developed.

Step 3, Mask Etching: (FIG. 1C) The metal film is etched through pattern in the top resist layer. Several etching techniques can be used, such as chemical etching, reactive ion etching and ion milling. As the metal film is generally thin (a few thousand A), the thickness of the top resist layer needed to withstand this etching does not have to be high. Therefore, a high aspect ratio of the pattern is not required.

Step 4, X-ray or Other Actinic Exposure: (FIG. 1D) X-ray or other actinic exposure is used to expose the bottom resist layer through the mask. After the exposure, the resist can be developed in the usual manner to achieve the final pattern with high aspect ratio.

This technique offers the potential of achieving high resolution patterns with an exposure written under direct computer control. In addition, registration of an overlaid pattern can be readily achieved using the electron beam automatic registration system. Also, the materials for the top resist layer to withstand the etching process can be selected from a wide range of choices. These include some negative resists with very high sensitivity which would be beneficial to high speed electron beam exposures.

What is claimed is:

1. A method of forming a predetermined high aspect ratio thin film pattern of openings in a resist structure including
   coating a substrate with a first layer of resist,
   applying a coating of a second layer of resist,
   said first layer being relatively thick compared to the minimum dimensions of said pattern openings as measured parallel to the surface of said layer,
   employing radiation with electrons from an electron beam operating to write said predetermined pattern in said second layer of resist with said minimum dimensions in said second layer,
   forming a corresponding metallic film pattern on said first layer,
   employing said thin metallic film pattern as a mask for exposing said first resist to actinic radiation to expose said predetermined pattern therein,
   developing said first resist,
   whereby a high aspect ratio structure with said predetermined pattern is achieved.

2. A method in accordance with claim 1 wherein
   after coating said substrate with said first layer of resist, said thin metallic film is applied on said first layer,
   next said second layer of resist is deposited, exposed to radiation with electrons and developed to provide openings to said metallic film in said predetermined pattern,
   next, said metallic film is etched through said openings to form said corresponding metallic film pattern to provide openings to said first layer of resist in said predetermined pattern, and
   then said first layer is exposed to actinic radiation through said openings and developed to yield deep openings in said first layer.

3. A method in accordance with claim 2 wherein said first resist and second resist layers are composed of substantially the same chemical composition.

4. A method in accordance with claim 2 wherein said first resist is exposed to actinic radiation in the 2 A to 5000 A range for straight side wall exposure through said metallic film.

5. A method in accordance with claim 2 wherein said second resist comprises a negative resist with very high sensitivity to electron radiation for providing high speed electron beam exposures.

6. A method in accordance with claim 1 wherein
   said second layer of resist is deposited directly upon said first layer, said second layer of resist is exposed to said radiation of electrons and developed, said thin metallic film is deposited upon said developed second layer and onto the top surfaces of said first layer, where said second layer has been developed away, the remainder of said second layer is dissolved and removed to form said corresponding metallic film pattern.

7. A method in accordance with claim 6 wherein said first resist is exposed to actinic radiation in the X-ray range for straight side wall exposure through said metallic film.

8. A method in accordance with claim 6 wherein said second resist comprises a negative resist with very high sensitivity to electron radiation for providing high speed electron beam exposures.

9. A method in accordance with claim 6 wherein said first layer of resist comprises PMMA and said second layer of resist comprises P(MMA/MAA) resist.

10. A method in accordance with claim 1 wherein said first resist layer is sensitive to radiation in the range from 2 A to 5000 A, and said second layer of resist is sensitive to electron radiation.

11. A method of forming a predetermined high aspect ratio thin film pattern of openings in a resist structure including coating a substrate with a first layer selected from PMMA resist and P(MMA/MAA) resist sensitive to actinic electromagnetic radiation in the range from 2 A to 5000 A wavelength, said first layer being relatively thick compared to the minimicron dimension of said pattern openings as measured parallel to the surface of said layer, applying a thin metallic film to said first layer, applying an electron sensitive resist to said thin metallic film, exposing said electron sensitive resist to an electron beam operating to write said predetermined pattern upon said electron resist, developing said electron resist to provide said openings in the form of said predetermined pattern in said electron resist, etching said thin metallic film through said openings, then employing said thin metallic film as a mask for exposing said first resist to radiation in the range from 2 A to 5000 A wavelength to expose said predetermined pattern therein and then developing said first resist, whereby a high aspect ratio structure with said predetermined pattern is achieved.

12. A method in accordance with claim 11 wherein said first film is exposed with X-ray radiation.

13. A method of forming a predetermined high aspect ratio pattern including

Coating a substrate with a first resist sensitive to radiation in the 2 A to 5000 A wavelength, and coating said first resist with a first layer of a metallic film, coating said metallic film with an electron sensitive resist, said first layer being relatively thick compared to the minimum dimensions of said pattern openings as measured parallel to the surface of said layer, exposing said electron sensitive resist to an electron beam operating to produce said predetermined pattern thereon and developing said electron resist to provide openings, etching said metallic film through said openings, then employing the pattern of said etched metallic film as a mask for exposing said first resist to electromagnetic radiation in the 2 A to 5000 A range and developing said first resist to provide a pattern with steep and straight side walls, whereby a high aspect ratio structure with said predetermined pattern is achieved.

14. A method in accordance with claim 1 wherein said first layer of resist is exposed to ultraviolet to X-ray range radiation.

15. A method in accordance with claim 2 wherein said first layer of resist is exposed to ultraviolet to X-ray range radiation.

16. A method in accordance with claim 6 wherein said first layer of resist is exposed to ultraviolet to X-ray range radiation.

* * * * *